United States Patent
Cheng

(10) Patent No.: US 11,619,849 B2
(45) Date of Patent: Apr. 4, 2023

(54) ARRAY SUBSTRATE, DISPLAY PANEL, DISPLAY DEVICE, AND METHOD OF MANUFACTURING ARRAY SUBSTRATE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1080 days.

(21) Appl. No.: 16/326,750

(22) PCT Filed: Aug. 16, 2018

(86) PCT No.: PCT/CN2018/100783
§ 371 (c)(1),
(2) Date: Feb. 20, 2019

(87) PCT Pub. No.: WO2019/080613
PCT Pub. Date: May 2, 2019

(65) Prior Publication Data
US 2022/0283470 A1    Sep. 8, 2022

(30) Foreign Application Priority Data

Oct. 24, 2017  (CN) .......................... 201721385002.2

(51) Int. Cl.
*G02F 1/1362* (2006.01)
*G02F 1/1368* (2006.01)

(52) U.S. Cl.
CPC ...... *G02F 1/136209* (2013.01); *G02F 1/1368* (2013.01); *G02F 1/136295* (2021.01)

(58) Field of Classification Search
CPC .................................................... G02F 1/1303
See application file for complete search history.

(56) References Cited

U.S. PATENT DOCUMENTS

2009/0002294 A1    1/2009  Horiguchi et al.
2014/0293199 A1*  10/2014  Sakae ............... G02F 1/134363
                                                           438/30

(Continued)

FOREIGN PATENT DOCUMENTS

CN      103676375     *   3/2014     ........... G02F 1/1362
CN      104597670 A      5/2015

(Continued)

OTHER PUBLICATIONS

Search Report and Written Opinion for International Application No. PCT/CN2018/100783 dated Nov. 14, 2018.

(Continued)

*Primary Examiner* — Sang V Nguyen
(74) *Attorney, Agent, or Firm* — Calfee, Halter & Griswold LLP

(57) ABSTRACT

An array substrate includes a base substrate; a data line located on the base substrate; a conductive shield layer located on a side of the data line facing away from the base substrate; a pixel electrode located on a side of the data line facing away from the base substrate; and a black matrix located on a side of the conductive shield layer facing away from the data line. The conductive shield layer is not in contact with the pixel electrode and the data line. Each of the conductive shield layer and the black matrix at least partially overlaps the data line in a direction perpendicular to the base substrate.

15 Claims, 6 Drawing Sheets

(56) References Cited

U.S. PATENT DOCUMENTS

| | | | |
|---|---|---|---|
| 2015/0311232 A1* | 10/2015 | Sun | G02F 1/136286 257/72 |
| 2016/0026049 A1* | 1/2016 | Park | G02F 1/133707 257/72 |
| 2016/0190178 A1 | 6/2016 | Ding et al. | |
| 2016/0216543 A1* | 7/2016 | Hong | G02F 1/136209 |
| 2016/0320650 A1* | 11/2016 | Ding | G02F 1/1368 |
| 2017/0108731 A1 | 4/2017 | Dong et al. | |
| 2017/0176825 A1* | 6/2017 | Cao | G02F 1/134309 |
| 2018/0175268 A1* | 6/2018 | Moon | H01L 27/15 |
| 2021/0202583 A1* | 7/2021 | Du | H01L 27/322 |

FOREIGN PATENT DOCUMENTS

| | | | | |
|---|---|---|---|---|
| CN | 104698706 A | | 6/2015 | |
| CN | 104880852 A | | 9/2015 | |
| CN | 206098392 | * | 4/2017 | G09F 9/30 |
| CN | 207265054 U | | 4/2018 | |

OTHER PUBLICATIONS

Communication from European Application No. 18869468.1 dated Jun. 30, 2021.

* cited by examiner

ARRAY SUBSTRATE, DISPLAY PANEL, DISPLAY DEVICE, AND METHOD OF MANUFACTURING ARRAY SUBSTRATE

CROSS REFERENCE TO RELATED APPLICATIONS

This application is the U.S. national phase entry of PCT/CN2018/100783, with an international filing date of Aug. 16, 2018, which claims the benefit of Chinese Patent Application No. 201721385002.2 filed Oct. 24, 2017, the entire disclosure of which is incorporated herein by reference.

TECHNICAL FIELD

The present disclosure relates to the field of display technologies, and in particular, to an array substrate, a display panel, a display device, and a method of manufacturing the array substrate.

BACKGROUND

A display device typically includes a display panel as a main structure, and the display panel generally includes an array substrate and a counter substrate opposite to the array substrate. In general, the array substrate includes a base substrate and a plurality of data lines and a plurality of gate lines on the base substrate, wherein the plurality of data lines and the plurality of gate lines intersect to define a plurality of pixel regions, each of which is provided with a pixel electrode. When the display device displays an image, display data voltages are applied to the respective pixel electrodes through the data lines to realize displaying of the image.

SUMMARY

According to an embodiment of the present disclosure, an array substrate is provided comprising: a base substrate; a data line located on the base substrate; a conductive shield layer located on a side of the data line facing away from the base substrate; a pixel electrode located on the side of the data line facing away from the base substrate; and a black matrix located on a side of the conductive shield layer facing away from the data line. The conductive shield layer is not in contact with the pixel electrode and the data line. Each of the conductive shield layer and the black matrix at least partially overlaps the data line in a direction perpendicular to the base substrate.

In some embodiments, in a width direction of the data line, an orthographic projection of the data line onto the base substrate falls within an orthographic projection of the conductive shield layer onto the base substrate, and the orthographic projection of the conductive shield layer onto the base substrate falls within an orthographic projection of the black matrix onto the base substrate.

In some embodiments, the conductive shield layer is disposed in a same layer as the pixel electrode.

In some embodiments, the array substrate further comprises a common electrode located on a side of the pixel electrode facing away from the base substrate and disposed in a same layer as the conductive shield layer.

In some embodiments, the common electrode comprises a slit electrode.

In some embodiments, the array substrate further comprises an interlayer insulating layer disposed between the pixel electrode and the common electrode.

In some embodiments, the array substrate further comprises a gate line located on the base substrate. Each of the conductive shield layer and the black matrix at least partially overlaps the gate line in the direction perpendicular to the base substrate, and wherein the conductive shield layer is not in contact with the gate line.

In some embodiments, in a width direction of the gate line, an orthographic projection of the gate line onto the base substrate falls within an orthographic projection of the conductive shield layer onto the base substrate, and the orthographic projection of the conductive shield layer onto the base substrate falls within an orthographic projection of the black matrix onto the base substrate.

In some embodiments, the array substrate further comprises a common electrode line disposed in a same layer as the gate line. In the width direction of the gate line, both an orthographic projection of the common electrode line onto the base substrate and an orthographic projection of the gate line onto the base substrate fall within an orthographic projection of the black matrix onto the base substrate.

In some embodiments, the array substrate further comprises: a thin film transistor comprising a gate electrode disposed in the same layer as the gate line and connected to the gate line, a source electrode disposed in a same layer as the data line and connected to the data line, and a drain electrode disposed in the same layer as the data line and connected to the pixel electrode; a passivation layer disposed between the thin film transistor and the pixel electrode; and a planarization layer disposed between the passivation layer and the pixel electrode.

In some embodiments, the array substrate further comprises a color film layer between the passivation layer and the pixel electrode.

In some embodiments, the conductive shield layer is configured to receive a constant voltage.

According to another embodiment of the present disclosure, a display panel is provided comprising the array substrate as described above.

According to yet another embodiment of the present disclosure, a display device is provided comprising the display panel as described above.

According to still yet another embodiment of the present disclosure, a method of manufacturing an array substrate is provided, comprising: providing a base substrate;

forming a gate line, a gate electrode and a common electrode line on the base substrate, the gate electrode being connected to the gate line; forming a gate insulating layer covering the gate electrode, the gate line, the common electrode line, and the base substrate; forming an active layer on the gate insulating layer, the active layer being located on a region of the gate insulating layer corresponding to the gate electrode; forming a source electrode, a drain electrode, and a data line, the source electrode and the drain electrode being in contact with the active layer, and the source electrode being connected to the data line; forming a passivation layer covering the source electrode, the drain electrode, the active layer, the data line, and the gate insulating layer; forming a planarization layer; forming a first via to expose the drain electrode; forming a pixel electrode connected to the drain electrode through the first via; forming a conductive shield layer that at least partially overlaps the data line in a direction perpendicular to the base substrate; and forming a black matrix covering the conductive shield layer.

In some embodiments, the method further comprises after the forming the passivation layer and before the forming the planarization layer, forming a color film layer covering the passivation layer.

In some embodiments, the method further comprises after the forming the pixel electrode and before the forming the conductive shield layer: forming an interlayer insulating layer covering the pixel electrode and the planarization layer; and forming a second via to expose the common electrode line. The forming the conductive shield layer further comprises forming a common electrode connected to the common electrode line through the second via.

These and other embodiments of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

Figure 1:
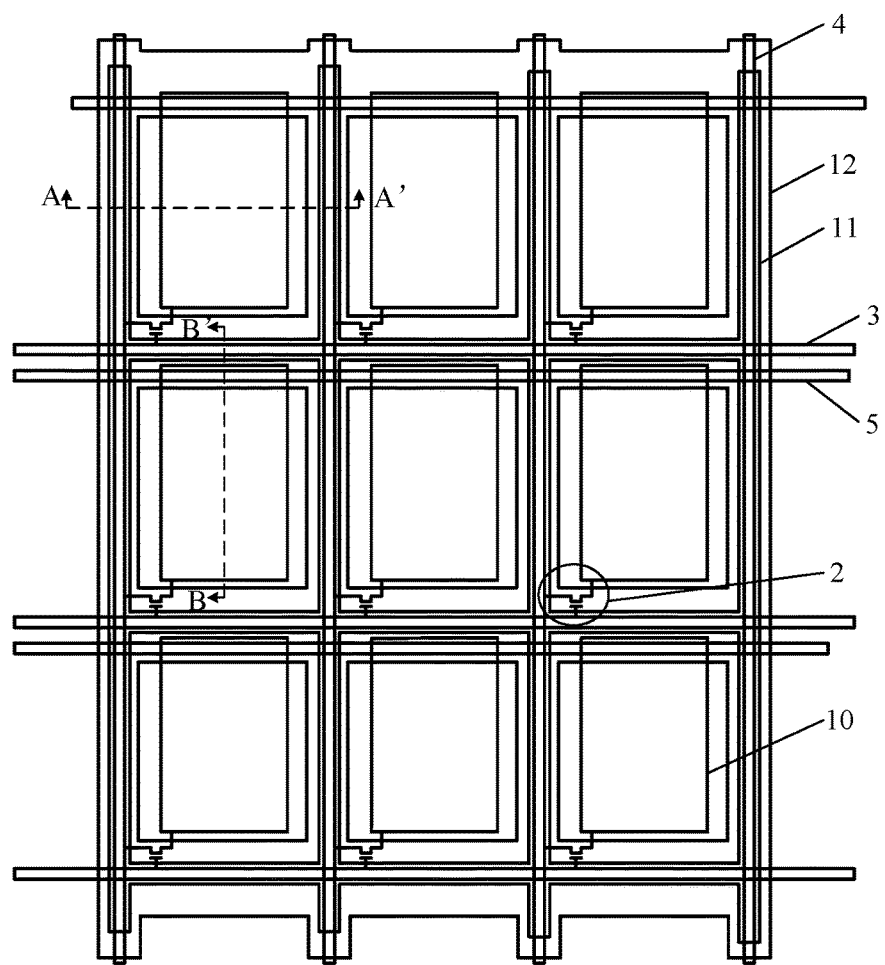
FIG. 1 is a plan view of an array substrate according to an embodiment of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure are described in detail below with reference to the accompanying drawings.

FIG. 1 is a plan view of an array substrate according to an embodiment of the present disclosure.

Referring to FIG. 1, in this example, a plurality of sub-pixels arranged in an array are shown. The sub-pixels in each column of sub-pixels are connected to a corresponding data line 4, and the sub-pixels in each row of sub-pixels are connected to a corresponding gate line 3. Each of the sub-pixels includes a thin film transistor 2 including a gate electrode connected to the corresponding gate line 3, a source electrode connected to the corresponding data line 4, and a drain electrode connected to a corresponding pixel electrode 10. When the thin film transistor 2 is turned on, a data voltage can be applied to the pixel electrode 10 via the data line 4. The gate electrode of the thin film transistor 2 may be disposed in the same layer as the gate line 3, and the source electrode and the drain electrode of the thin film transistor 2 may be disposed in the same layer as the data line 4. The thin film transistor 2 may be an amorphous silicon thin film transistor, a single crystal silicon thin film transistor, a polycrystalline silicon thin film transistor such as a low temperature polysilicon thin film transistor, a metal oxide thin film transistor, or the like.

Figure 2:
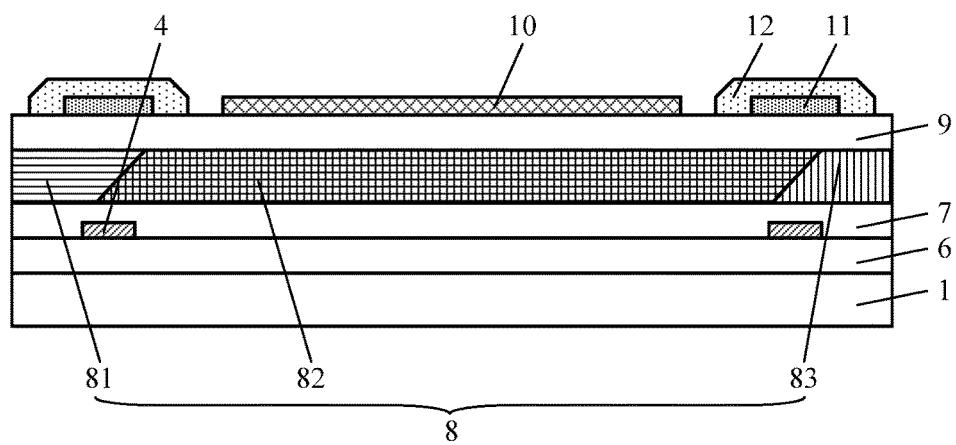
FIG. 2 is a cross-sectional view taken along line A-A' of FIG. 1.

FIG. 2 is a cross-sectional view taken along line A-A' of FIG. 1. The structure of the array substrate of FIG. 1 is described below from the perspective of a single sub-pixel, but it will be understood that the array substrate includes a plurality of such sub-pixels, as shown in the example of FIG. 1.

Referring to FIG. 2, the array substrate includes a base substrate 1, and a data line 4, a conductive shield layer 11, a pixel electrode 10, and a black matrix 12 that are located on the base substrate 1. The conductive shield layer 11 and the pixel electrode 10 are both located on a side of the data line 4 facing away from the base substrate 1. That is, both the conductive shield layer 11 and the pixel electrode 10 are located above the data line 4 in FIG. 2 or 5. The conductive shield layer 11 is not in contact with the pixel electrode 10 and the data line 4. Each of the conductive shield layer 11 and the black matrix 12 at least partially overlaps the data line 4 in a direction perpendicular to the base substrate 1. The black matrix 12 is located on a side of the conductive shield layer 11 facing away from the data line 4, that is, the black matrix 12 is located above the conductive shield layer 11 in FIG. 2 or 5. Specifically, the black matrix 12 covers the conductive shield layer 11.

In a conventional array substrate in which the conductive shield layer 11 is not provided, there is usually a coupling electric field between the data line 4 and the pixel electrode 10 which adversely affects the voltage applied to the pixel electrode, thereby causing deterioration in the display quality of the display device.

In contrast, due to the conductive shield layer 11 at least partially overlapping the data line 4, a coupling electric field can be formed between the conductive shield layer 11 and the data line 4, which in turn reduces the coupling electric field between the data line 4 and the pixel electrode 10. This would be advantageous because it alleviates or eliminates the adverse effect on the voltage of the pixel electrode 10, thereby improving the display quality of the display device. In embodiments, the conductive shield layer 11 may be in a suspended state, that is, no voltage is supplied to the conductive shield layer 11. Alternatively, the conductive shield layer 11 may be supplied with a constant voltage. For example, the conductive shield layer 11 may be connected to a voltage source that supplies a common voltage such that it is supplied with the common voltage.

In addition, disposing the black matrix 12 on the side of the conductive shield layer 11 facing away from the data line 4 avoids the black matrix 12 from separating the conductive shield layer 11 from the data line 4, and thus reduces the distance between the conductive shield layer 11 and the data line 4. This can enhance the coupling electric field between the conductive shield layer 11 and the data line 4, and hence contribute to the reduction of the coupling electric field between the data line 4 and the pixel electrode 10, thereby further improving the display quality of the display device.

Each of the conductive shield layer 11 and the black matrix 12 at least partially overlaps the data line 4 in a direction perpendicular to the base substrate 1. Referring to FIGS. 1 and 2, in this example, in a width direction of the data line 4, an orthographic projection of the data line 4 onto the base substrate 1 falls within an orthographic projection of the conductive shield layer 11 onto the base substrate 1, and the orthographic projection of the conductive shield layer 11 onto the base substrate 1 falls within an orthographic projection of the black matrix 12 onto the base substrate 1. In other embodiments, in the width direction of the data line 4, the orthographic projection of the data line 4 onto the base substrate 1 may partially fall within the orthographic projection of the conductive shield layer 11 onto the base substrate 1. The width direction of the data line 4 refers to a direction perpendicular to the extending direction of the data line 4, or it may also be understood as the row direction of the array substrate, that is, the horizontal direction in FIG. 1 or 4.

In this embodiment, since the orthographic projection of the data line 4 onto the base substrate 1 falls within the orthographic projection of the conductive shield layer 11 onto the base substrate 1, the intensity of the coupling electric field between the conductive shield layer 11 and the data line 4 can be increased, thereby reducing the coupling electric field between the data line 4 and the pixel electrode 10. In addition, since the orthographic projection of the conductive shield layer 11 onto the base substrate 1 falls within the orthographic projection of the black matrix 12 onto the base substrate 1, the black matrix 12 can completely cover the conductive shield layer 11 and the data line 4, preventing the degraded visual effect caused by the undesired exposure of the conductive shield layer 11 and the data lines 4.

In this embodiment, the conductive shield layer 11 and the pixel electrode 10 are both located on a side of the data line 4 facing away from the base substrate 1. Specifically, the conductive shield layer 11 is disposed in the same layer as the pixel electrode 10, as shown in FIG. 2. In this case, the conductive shield layer 11 and the pixel electrode 10 can be formed by a one-time patterning process and using the same material, thereby reducing the process steps for manufacturing the array substrate, improving the manufacturing efficiency, and reducing the manufacturing cost.

Continue referring to FIG. 2, a gate insulating layer 6 is disposed between the data line 4 and the substrate 1, and a passivation layer 7 is disposed between the thin film transistor 2 (not shown in FIG. 2) and the pixel electrode 10. A color film layer 8 is disposed between the passivation layer 7 and the pixel electrode 10, and a planarization layer 9 is disposed between the color film layer 8 and the pixel electrode 10. The configuration of the color film layer 8 is dependent upon the color mode of the display device. When the display device adopts an RGB color mode, the color film layer 8 may include an R color film 81, a G color film 82, and a B color film 83, wherein the R color film 81 is located in a corresponding red sub-pixel, and the G color film 82 is located in a corresponding green sub-pixel, and the B color film 83 is located in a corresponding blue sub-pixel. In an alternative embodiment, the color film layer 8 can be provided on a counter substrate (not shown) opposite to the array substrate.

Figure 3:
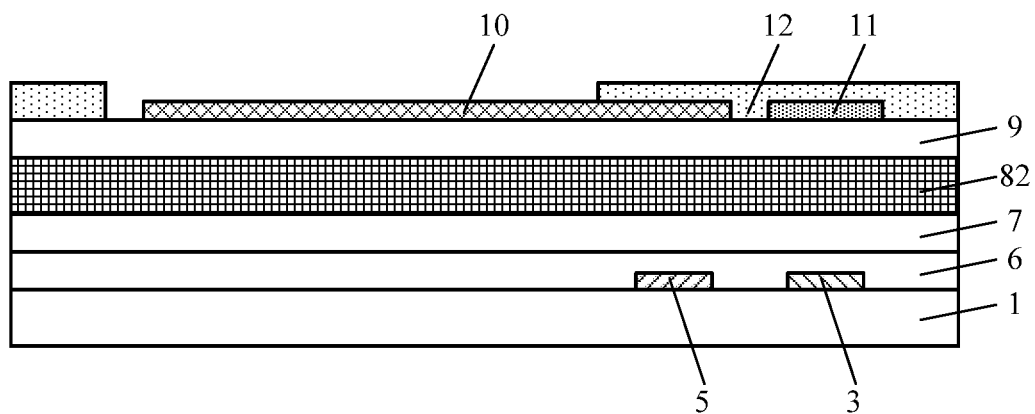
FIG. 3 is a cross-sectional view taken along line B-B' of FIG. 1.

FIG. 3 is a cross-sectional view taken along line B-B' of FIG. 1.

Referring to FIG. 3, the gate line 3 is located on the base substrate 1, and the conductive shield layer 11 is not in contact with the gate line 3. Each of the conductive shield layer 11 and the black matrix 12 at least partially overlaps the gate line 3 in a direction perpendicular to the base substrate 1. In this embodiment, in a width direction of the gate line 3, an orthographic projection of the gate line 3 onto the base substrate 1 falls within an orthographic projection of the conductive shield layer 11 onto the base substrate 1, and the orthographic projection of the conductive shield layer 11 onto the base substrate 1 falls within an orthographic projection of the black matrix 12 onto the base substrate 1. In other embodiments, in the width direction of the gate line 3, the orthographic projection of the gate line 3 onto the base substrate 1 may partially fall within the orthographic projection of the conductive shield layer 11 onto the base substrate 1. The width direction of the gate line 3 refers to a direction perpendicular to the extending direction of the gate line 3, or it can also be understood as the column direction of the array substrate, that is, the vertical direction in FIG. 1.

In this embodiment, since the orthographic projection of the gate line 3 onto the base substrate 1 falls within the orthographic projection of the conductive shield layer 11 onto the base substrate 1, a coupling electric field can be formed between the conductive shield layer 11 and the gate line 3. It can reduce the coupling electric field between the gate line 3 and the pixel electrode 10, thereby alleviating or eliminating the adverse effect of the signal on the gate line 3 on the voltage of the pixel electrode 10, and improving the display quality of the display device. In addition, since the orthographic projection of the conductive shield layer 11 onto the base substrate 1 falls within the orthographic projection of the black matrix 12 onto the base substrate 1, the black matrix 12 can completely cover the conductive shield layer 11 and the data line 4, preventing the degraded visual effect caused by the undesired exposure of the conductive shield layer 11 and the data lines 4.

Continue referring to FIG. 3, the array substrate further includes a common electrode line 5 disposed in the same layer as the gate line 3. In the width direction of the gate line 3, both the orthographic projection of the common electrode line 5 onto the base substrate 1 and the orthographic projection of the gate line 3 onto the base substrate 1 fall within the orthographic projection of the black matrix 12 onto the base substrate 1. That is, in the width direction of the gate line 3, the orthographic projection of the black matrix 12 onto the base substrate 1 may cover the orthographic projections of both the gate line 3 and the common electrode line 5 located beside the gate line 3 onto the base substrate 1, thus preventing the common electrode line 5 and the gate line 3 from being exposed. The array substrate shown in FIG. 3 does not include a common electrode, and the common electrode may be provided on a counter substrate (not shown) opposite to the array substrate.

Figure 4:
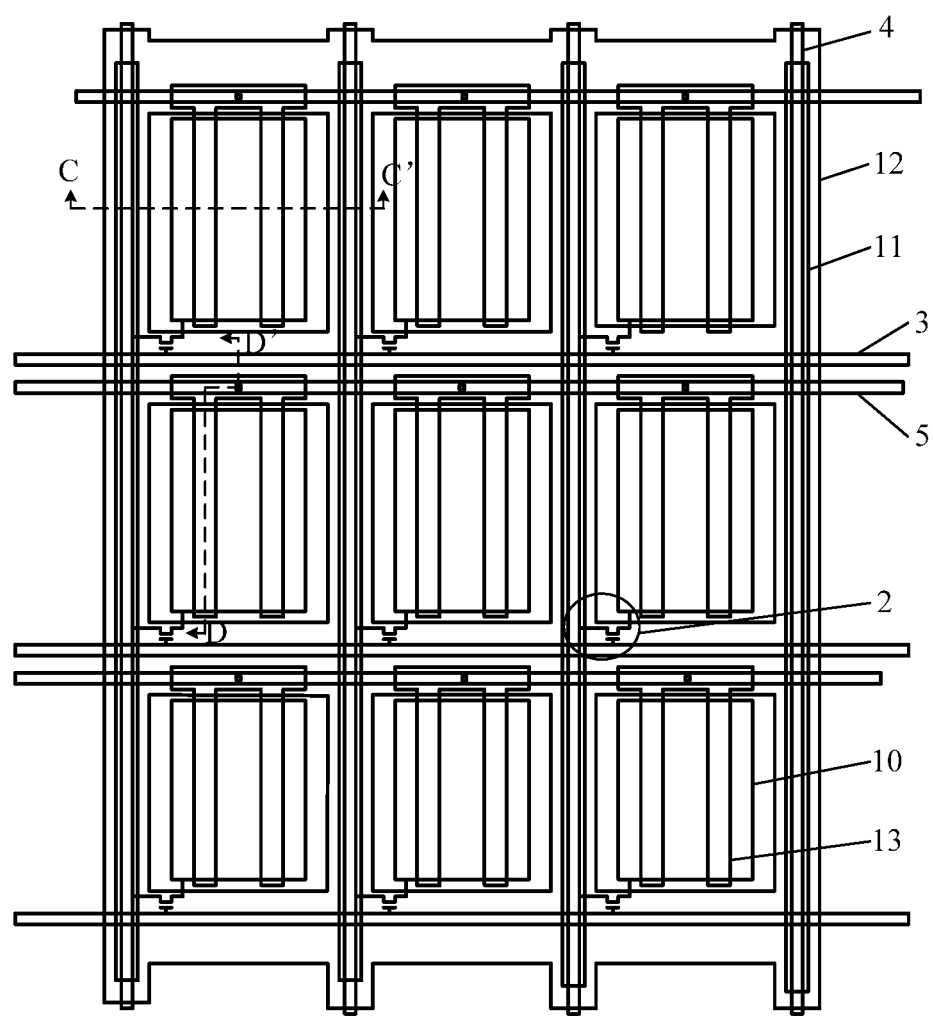
FIG. 4 is a plan view of another array substrate according to an embodiment of the present disclosure.

FIG. 4 is a plan view of another array substrate according to an embodiment of the present disclosure. The same reference numerals as in FIG. 1 denote the same elements.

Referring to FIG. 4, in this example, a plurality of sub-pixels arranged in an array are shown. The sub-pixels in each column of sub-pixels are connected to a corresponding data line 4, and the sub-pixels in each row of sub-pixels are connected to a corresponding gate line 3. Each of the sub-pixels includes a thin film transistor 2 including a gate electrode connected to the corresponding gate line 3, a source electrode connected to the corresponding data line 4, and a drain electrode connected to a corresponding pixel electrode 10. When the thin film transistor 2 is turned on, a data voltage can be applied to the pixel electrode 10 via the data line 4.

Unlike the embodiment shown in FIG. 1, in the array substrate of FIG. 4, each sub-pixel further includes a common electrode 13, which in this example is a slit electrode. The common electrode 13 receives a common voltage via a corresponding common electrode line 5. In response to the common voltage applied to the common electrode 13 and the data voltage applied to the pixel electrode 10, the liquid crystal layer (not shown) in the sub-pixel can be controlled to deflect a corresponding angle, thereby completing the display function.

Figure 5:
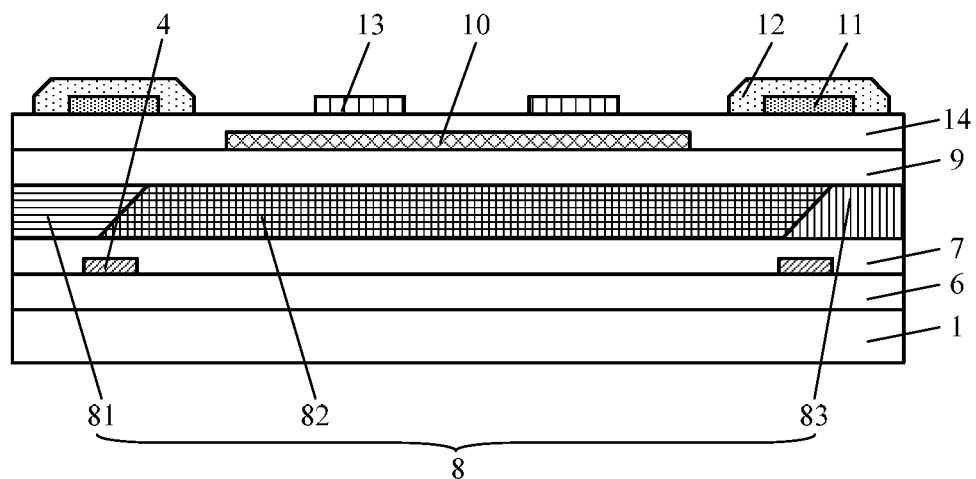
FIG. 5 is a cross-sectional view taken along line C-C' of FIG. 4.

FIG. 5 is a cross-sectional view taken along line C-C' in FIG. 4. The structure of the array substrate of FIG. 4 is described below from the perspective of a single sub-pixel, but it will be understood that the array substrate includes a plurality of such sub-pixels, as shown in the example of FIG. 4.

The cross-sectional structure shown in FIG. 5 is similar to that shown in FIG. 2, and the description of the same configuration is omitted here for the sake of brevity. As shown in FIG. 5, the pixel electrode 10 is formed on a planarization layer 9, and an interlayer insulating layer 14 is disposed on the pixel electrode 10, wherein the interlayer insulating layer 14 covers the pixel electrode 10 and the planarization layer 9. The conductive shield layer 11 and the common electrode 13 are formed on the interlayer insulating layer 14. That is, the conductive shield layer 11 is disposed in the same layer as the common electrode 13. In this case, the conductive shield layer 11 and the common electrode 13 can be formed by a one-time patterning process and using the same material, thereby reducing process steps for manufacturing the array substrate, improving the manufacturing efficiency, and reducing the manufacturing cost.

Figure 6:
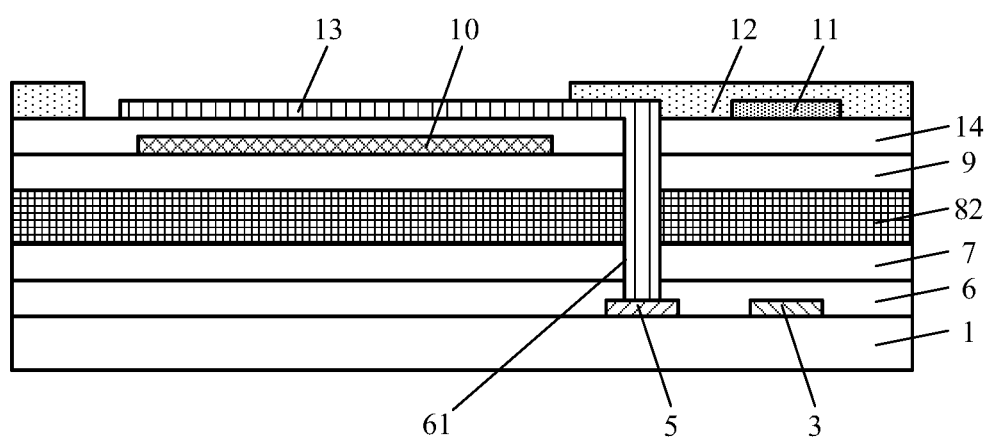
FIG. 6 is a cross-sectional view taken along line D-D' in FIG. 4.

FIG. 6 is a cross-sectional view taken along line D-D' in FIG. 4.

The cross-sectional structure shown in FIG. 6 is similar to that shown in FIG. 3, and the description of the same configuration is omitted here for the sake of brevity. As shown in FIG. 6, the common electrode line 5 is disposed in the same layer as the gate line 3. In this example, since the array substrate is provided with the common electrode 13, a via 61 extending through the gate insulating layer 6, the passivation layer 7, the color film 82, the planarization layer 9, and the interlayer insulating layer 14 are provided to electrically connect the common electrode line 5 to the common electrode 13.

Figure 7:
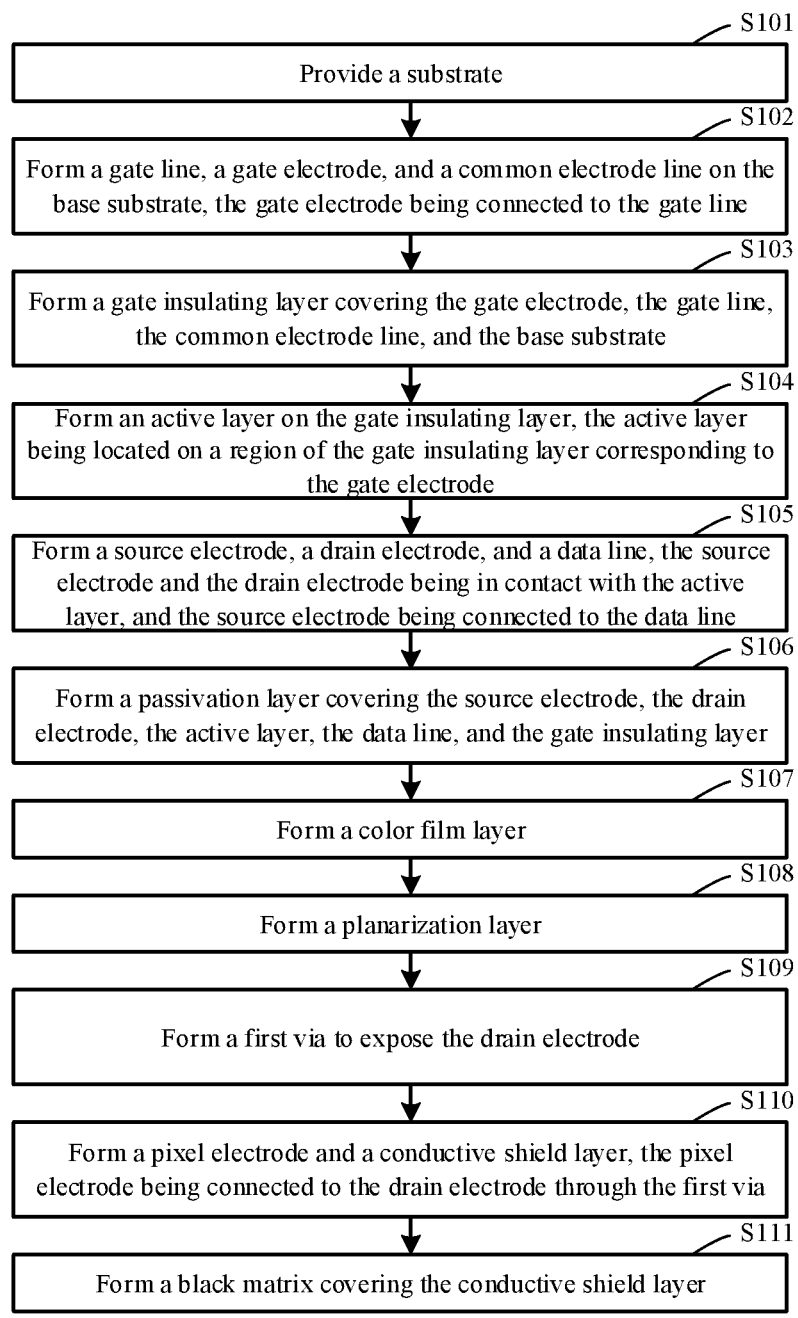
FIG. 7 is a flow chart of a method of manufacturing an array substrate according to an embodiment of the present disclosure.

FIG. 7 is a flow chart of a method of manufacturing an array substrate (e.g., as shown in FIGS. 1-3) that does not include a common electrode, in accordance with an embodiment of the present disclosure. The method is described below from the perspective of a single sub-pixel, but it will be understood that the array substrate includes a plurality of sub-pixels.

Referring to FIG. 7, the method includes the following steps.

At step S101, a substrate is provided. In an exemplary embodiment, the base substrate may be a glass substrate.

At step S102, a gate line, a gate electrode, and a common electrode line are formed on the base substrate, and the gate electrode is connected to the gate line. In an exemplary embodiment, the gate line, the gate electrode, and the common electrode line may be formed by depositing a conductive film layer on the base substrate using a sputtering method, and then by adopting a patterning process (i.e., coating photoresist, exposing, developing, etching, and removing residual photoresist). The gate line, the gate electrode and the common electrode line may be made of a metal material such as copper (Cu), aluminum (Al), molybdenum (Mo), titanium (Ti), chromium (Cr), or tungsten (W), or an alloy composed of at least two of copper (Cu), aluminum (Al), molybdenum (Mo), titanium (Ti), chromium (Cr), tungsten (W), and the like. The gate line, the gate electrode, and the common electrode line may be a single layer structure or a multilayer structure. In the case of the multilayer structure, each of the gate line, the gate electrode, and the common electrode line may be of a structure such as Mo\Al\Mo, Ti\Cu\Ti, Mo\Ti\Cu, and the like.

At step S103, a gate insulating layer is formed covering the gate electrode, the gate line, the common electrode line, and the base substrate. In an exemplary embodiment, the gate insulating layer may be deposited using plasma enhanced chemical vapor deposition (PECVD). The material of the gate insulating layer may be silicon oxide (SiOx), silicon nitride (SiNx), silicon oxynitride (SiNO) or the like. The gate insulating layer may have a single layer structure or a multilayer structure. In the case of the multilayer structure, the gate insulating layer may be silicon oxide/ silicon nitride.

At step S104, an active layer is formed on the gate insulating layer with the active layer being located on a region of the gate insulating layer corresponding to the gate electrode. In an exemplary embodiment, where the thin film transistor is an amorphous silicon thin film transistor, an a-Si semiconductor layer may be deposited by PECVD, and where the thin film transistor is a metal oxide thin film transistor, the a metal oxide (e.g., indium gallium zinc oxide (IGZO)) semiconductor layer may be deposited by sputtering. The active layer is then formed by a patterning process.

At step S105, a source electrode, a drain electrode, and a data line are formed with the source electrode and the drain electrode being in contact with the active layer, and the source electrode being connected to the data line. In an exemplary embodiment, the source electrode, the drain electrode, and the data line may be formed by depositing a conductive film layer on the base substrate using a sputtering method, and then by adopting a patterning process (i.e., coating photoresist, exposing, developing, etching, and removing residual photoresist). The source electrode, the drain electrode and the data line may be made of a metal material such as copper (Cu), aluminum (Al), molybdenum (Mo), titanium (Ti), chromium (Cr), or tungsten (W), or an alloy composed of at least two of copper (Cu), aluminum (Al), molybdenum (Mo), titanium (Ti), chromium (Cr), tungsten (W), and the like. The source electrode, the drain electrode, and the data line may be a single layer structure or a multilayer structure. In the case of the multilayer structure, each of the source electrode, the drain electrode, and the data line may be of a structure such as Mo\Al\Mo, Ti\Cu\Ti, Mo\Ti\Cu, and the like.

At step S106, a passivation layer is formed covering the source electrode, the drain electrode, the active layer, the data line, and the gate insulating layer. In an exemplary embodiment, the passivation layer may be deposited using PECVD. The material of the passivation layer may be silicon oxide (SiOx), silicon nitride (SiNx), silicon oxynitride (SiNO) or the like. The passivation layer may be a single layer structure or a multilayer structure. In the case of the multilayer structure, the passivation layer may be silicon oxide\silicon nitride.

At step S107, a color film layer is formed covering the passivation layer. In an exemplary embodiment, the material of the color film layer may be a color photoresist material. Taking the RGB color mode as an example, the color film layer includes an R color film, a G color film, and a B color film. The R color film can be formed by first depositing a layer of an R photoresist material, followed by exposure and development. The G color film can be formed by first depositing a layer of a G photoresist material, followed by exposure and development. The B color film can be formed by first depositing a layer of a B photoresist material, followed by exposure and development. In an alternative embodiment, step S107 may be omitted because the color film layer may alternatively be formed on a counter substrate (not shown) disposed opposite to the array substrate.

At step S108, a planarization layer is formed. In an exemplary embodiment, the material of the planarization layer may be an organic resin material.

At step S109, a first via is formed to expose the drain electrode. In this embodiment, the first via extends through the planarization layer, the color film layer, and the passivation layer.

At step S110, a pixel electrode is formed, which is connected to the drain electrode through the first via. In this embodiment, step S110 further includes forming a conductive shield layer that at least partially overlaps the data line in a direction perpendicular to the base substrate. In an exemplary embodiment, the pixel electrode and the conductive shield layer may be formed by depositing a conductive film layer using sputtering, and then by adopting a patterning process. The material of the pixel electrode and the conductive shield layer may be a transparent metal oxide conductive material such as indium tin oxide (ITO) or indium zinc oxide (IZO).

At step S111, a black matrix is formed covering the conductive shield layer. In an exemplary embodiment, the material of the black matrix may be a black photoresist material. The black matrix can be formed by first depositing a black photoresist material film layer, followed by exposure and development.

Figure 8:
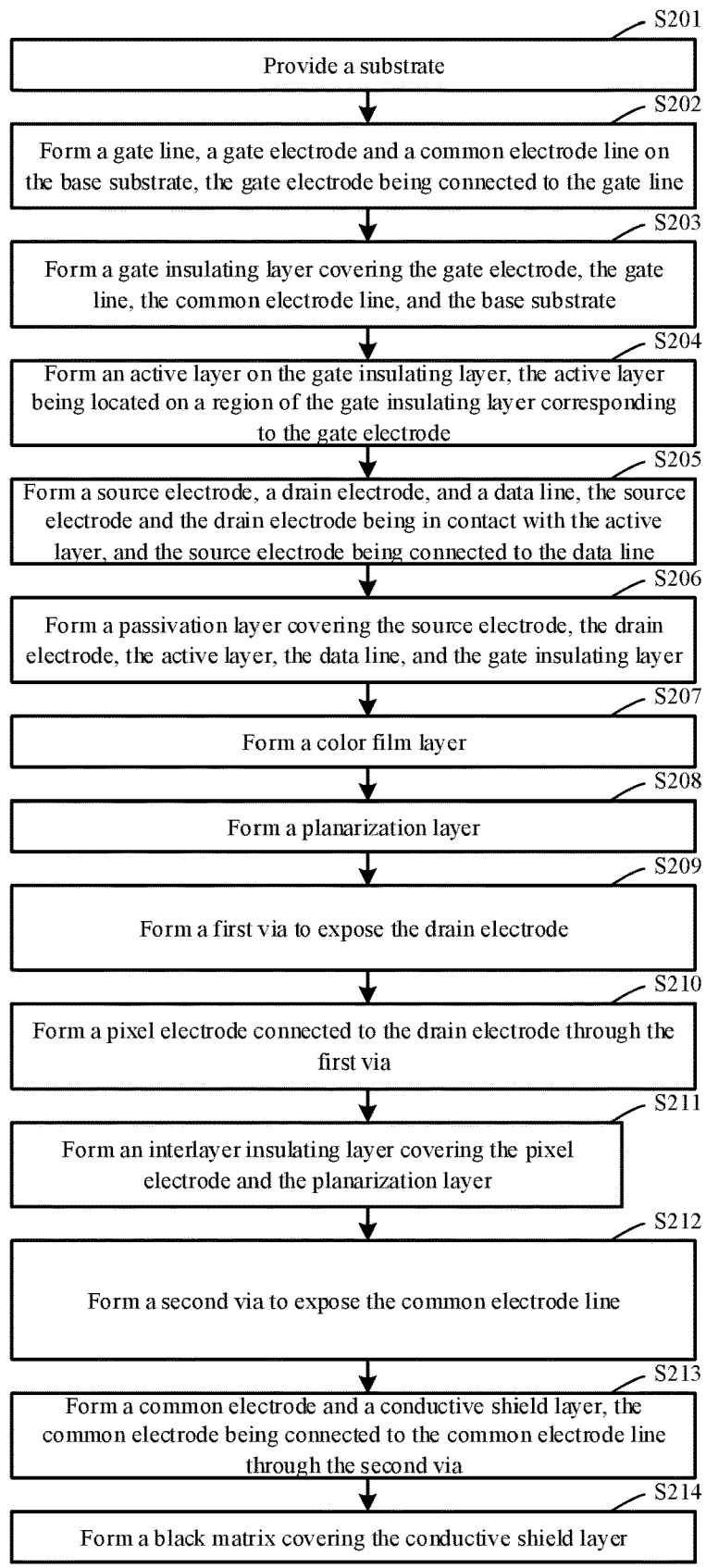
FIG. 8 is a flow chart of another method of manufacturing an array substrate according to an embodiment of the present disclosure.

FIG. 8 is a flow chart of a method of manufacturing an array substrate (e.g., as shown in FIGS. 4-6) that includes a common electrode, in accordance with an embodiment of the present disclosure. The method is described below from the perspective of a single sub-pixel, but it will be understood that the array substrate includes a plurality of sub-pixels.

Referring to FIG. 8, the method includes the following steps.

At step S201, a substrate is provided. In an exemplary embodiment, the base substrate may be a glass substrate.

At step S202, a gate line, a gate electrode and a common electrode line are formed on the base substrate with the gate electrode being connected to the gate line.

In an exemplary embodiment, the gate line, the gate electrode, and the common electrode line may be formed by depositing a conductive film layer on the base substrate using a sputtering method, and then by adopting a patterning process (i.e., coating photoresist, exposing, developing, etching, and removing residual photoresist). The gate line, the gate electrode and the common electrode line may be made of a metal material such as copper (Cu), aluminum (Al), molybdenum (Mo), titanium (Ti), chromium (Cr), or tungsten (W), or an alloy composed of at least two of copper (Cu), aluminum (Al), molybdenum (Mo), titanium (Ti), chromium (Cr), tungsten (W), and the like. The gate line, the gate electrode, and the common electrode line may be a single layer structure or a multilayer structure. In the case of the multilayer structure, each of the gate line, the gate electrode, and the common electrode line may be of a structure such as Mo\Al\Mo, Ti\Cu\Ti, Mo\Ti\Cu, and the like.

At step S203, a gate insulating layer is formed covering the gate electrode, the gate line, the common electrode line, and the base substrate. In an exemplary embodiment, the gate insulating layer may be deposited using plasma enhanced chemical vapor deposition (PECVD). The material of the gate insulating layer may be silicon oxide (SiOx), silicon nitride (SiNx), silicon oxynitride (SiNO) or the like. The gate insulating layer may have a single layer structure or a multilayer structure. In the case of the multilayer structure, the gate insulating layer may be silicon oxide/silicon nitride.

At step S204, an active layer is formed on the gate insulating layer with the active layer being located on a region of the gate insulating layer corresponding to the gate electrode. In an exemplary embodiment, where the thin film transistor is an amorphous silicon thin film transistor, an a-Si semiconductor layer may be deposited by PECVD, and where the thin film transistor is a metal oxide thin film transistor, a metal oxide semiconductor layer (e.g., an indium gallium zinc oxide (IGZO) semiconductor layer) may be deposited by sputtering. The active layer is then formed by a patterning process.

At step S205, a source electrode, a drain electrode, and a data line are formed with the source electrode and the drain electrode being in contact with the active layer, and the source electrode being connected to the data line. In an exemplary embodiment, the source electrode, the drain electrode, and the data line may be formed by depositing a conductive film layer on the base substrate using a sputtering method, and then by adopting a patterning process (i.e., coating photoresist, exposing, developing, etching, and removing residual photoresist). The source electrode, the drain electrode and the data line may be made of a metal material such as copper (Cu), aluminum (Al), molybdenum (Mo), titanium (Ti), chromium (Cr), or tungsten (W), or an alloy composed of at least two of copper (Cu), aluminum (Al), molybdenum (Mo), titanium (Ti), chromium (Cr), tungsten (W), and the like. The source electrode, the drain electrode, and the data line can be a single layer structure or a multilayer structure. In the case of the multilayer structure, each of the source electrode, the drain electrode, and the data line may be of a structure such as Mo\Al\Mo, Ti\Cu\Ti, Mo\Ti\Cu, and the like.

At step S206, a passivation layer is formed covering the source electrode, the drain electrode, the active layer, the data line, and the gate insulating layer. In an exemplary embodiment, the passivation layer may be deposited using plasma enhanced chemical vapor deposition (PECVD). The material of the passivation layer may be silicon oxide (SiOx), silicon nitride (SiNx), silicon oxynitride (SiNO) or the like. The passivation layer may have a single layer structure or a multilayer structure. In the case of the multilayer structure, the passivation layer may be silicon oxide\silicon nitride.

At step S207, a color film layer is formed covering the passivation layer. In an exemplary embodiment, the material of the color film layer may be a color photoresist material. Taking the RGB color mode as an example, the color film layer includes an R color film, a G color film, and a B color film. The R color film can be formed by first depositing a layer of an R photoresist material, followed by exposure and development. The G color film can be formed by first depositing a layer of a G photoresist material, followed by exposure and development. The B color film can be formed by first depositing a layer of a B photoresist material, followed by exposure and development. In an alternative embodiment, step S207 may be omitted because the color film layer may alternatively be formed on a counter substrate (not shown) disposed opposite to the array substrate.

At step S208, a planarization layer is formed. In an exemplary embodiment, the material of the planarization layer may be an organic resin material.

At step S209, a first via is formed to expose the drain electrode. In this embodiment, the first via extends through the planarization layer, the color film layer, and the passivation layer.

At step S210, a pixel electrode is formed, which is connected to the drain electrode through the first via. In an exemplary embodiment, the pixel electrode may be formed by depositing a conductive film layer using sputtering, and then by adopting a patterning process. The material of the pixel electrode may be a transparent metal oxide conductive material such as indium tin oxide (ITO) or indium zinc oxide (IZO).

At step S211, an interlayer insulating layer is formed covering the pixel electrode and the planarization layer. In an exemplary embodiment, the interlayer insulating layer may be deposited using PECVD. The material of the interlayer insulating layer may be silicon oxide (SiOx), silicon nitride (SiNx), silicon oxynitride (SiNO) or the like. The interlayer insulating layer may have a single layer structure or a multilayer structure. In the case of the multilayer structure, the interlayer insulating layer may be silicon oxide/silicon nitride.

At step S212, a second via is formed to expose the common electrode line. In this embodiment, the second via extends through the interlayer insulating layer, the planarization layer, the color filter layer, the passivation layer, and the gate insulating layer.

At step S213, a common electrode is formed, which is connected to the common electrode line through the second via. In this embodiment, step S213 further includes forming a conductive shield layer that at least partially overlaps the data line in a direction perpendicular to the base substrate. In an exemplary embodiment, the common electrode and the conductive shield layer may be formed by depositing a conductive film layer using sputtering, and then by adopting a patterning process. The material of the common electrode and the conductive shield layer may be a transparent metal oxide conductive material such as indium tin oxide (ITO) or indium zinc oxide (IZO).

At step S214, a black matrix is formed covering the conductive shield layer. In an exemplary embodiment, the material of the black matrix may be a black photoresist material. The black matrix can be formed by first depositing a black photoresist material film layer, followed by exposure and development.

Figure 9:
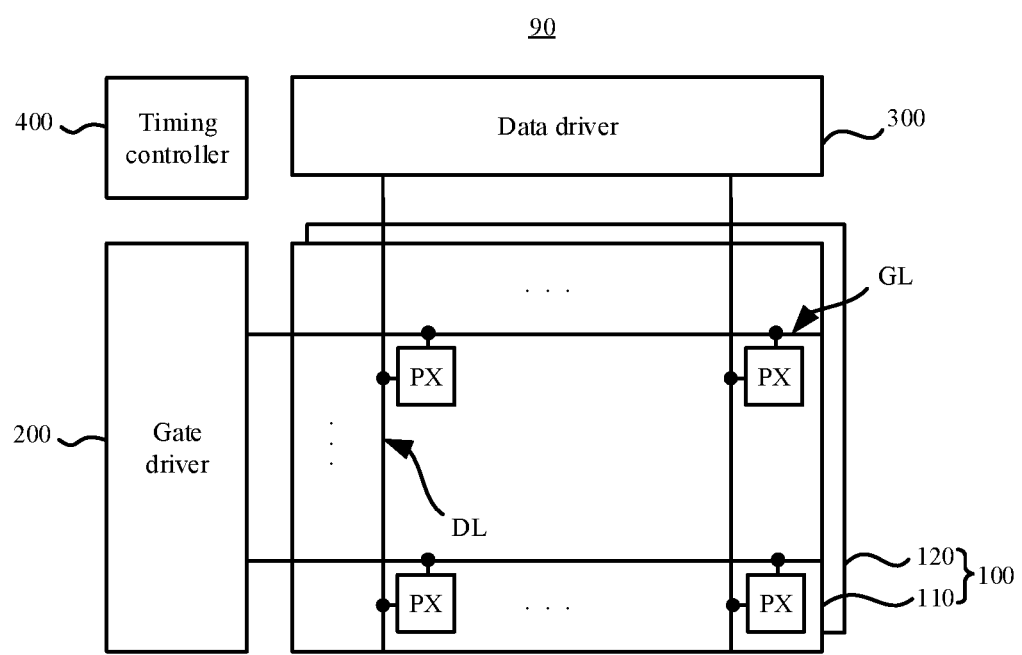
FIG. 9 is a schematic block diagram of a display device according to an embodiment of the present disclosure.

FIG. 9 is a schematic block diagram of a display device 90 according to an embodiment of the present disclosure. By way of example and not limitation, the display device 90 can be any product or component having a display function, such as a cell phone, a tablet, a television, a display, a notebook computer, a digital photo frame, a navigator, and the like.

Referring to FIG. 9, the display device 90 includes a display panel 100 for displaying images, a gate driver 200 for outputting gate scan signals to the display panel 100, a data driver 300 for outputting data voltages to the display panel 100, and a timing controller 400 for controlling the gate driver 200 and the data driver 300.

The display panel 100 includes an array substrate 110 and a counter substrate 120 opposite to the array substrate 110.

In the case of a liquid crystal display device, the display panel 100 further includes a liquid crystal layer (not shown) sandwiched between the array substrate 110 and the counter substrate 120. The array substrate 110 includes a plurality of pixel regions PX arranged in an array. The pixel regions PX are located at respective intersections of the plurality of gate lines GL and the plurality of data lines DL. Each of the pixel regions includes a pixel that includes a thin film transistor (not shown) and other associated components. The array substrate 110 can take the form of any of the array substrates described above with respect to FIGS. 1 to 6.

The gate driver 200 is electrically connected to first ends of the respective gate lines GL, thereby sequentially applying gate scan signals to the respective gate lines GL. In some exemplary embodiments, the gate driver 200 may be directly mounted (e.g., integrated) in the array substrate 110. Alternatively, the gate driver 200 may be connected to the display panel 100 through a Tape Carrier Package (TCP).

The data driver 300 is electrically connected to first ends of the respective data lines DL to output data voltages to the respective data lines DL. In some embodiments, data driver 300 can include a plurality of data driving chips operating in parallel.

The timing controller 400 controls the operation of each of the gate driver 200 and the data driver 300. Specifically, the timing controller 400 outputs data control signals and image data to control the driving operation of the data driver 300, and outputs gate control signals to control the driving operation of the gate driver 200. The data control signals and the image data are applied to the data driver 300. The gate control signals are applied to the gate driver 200.

In the description of the above embodiments, specific features, structures, materials or characteristics may be combined in any suitable manner in any one or more embodiments or examples. The foregoing is only the specific embodiments of the present disclosure, and the scope of the present disclosure is not limited thereto. Various variations or substitutions may be devised by those skilled in the art without departing from the scope of the disclosure. Therefore, the scope of the disclosure should be subject to the appended claims.

What is claimed is:

1. An array substrate, comprising:
   a base substrate;
   a data line located on the base substrate;
   a conductive shield layer located on a side of the data line facing away from the base substrate;
   a pixel electrode located on the side of the data line facing away from the base substrate;
   a common electrode located on a side of the pixel electrode facing away from the base substrate and disposed in a same layer as the conductive shield layer;
   a gate line located on the base substrate;
   a common electrode line disposed in a same layer as the gate line; and
   a black matrix located on a side of the conductive shield layer facing away from the data line,
   wherein the common electrode is connected to the common electrode line through a via,
   wherein the conductive shield layer is not in contact with the pixel electrode and the data line,
   wherein each of the conductive shield layer and the black matrix at least partially overlaps the data line when viewed from a direction perpendicular to the base substrate, and
   wherein the black matrix covers and contacts the conductive shield layer, the via and a portion of the common electrode.

2. The array substrate of claim 1, wherein, in a width direction of the data line, an orthographic projection of the data line onto the base substrate falls within an orthographic projection of the conductive shield layer onto the base substrate, and the orthographic projection of the conductive shield layer onto the base substrate falls within an orthographic projection of the black matrix onto the base substrate.

3. The array substrate of claim 1, wherein the common electrode comprises a slit electrode.

4. The array substrate of claim 1, further comprising an interlayer insulating layer disposed between the pixel electrode and the common electrode.

5. The array substrate according to claim 1, wherein each of the conductive shield layer and the black matrix at least partially overlaps the gate line when viewed from the direction perpendicular to the base substrate, and wherein the conductive shield layer is not in contact with the gate line.

6. The array substrate of claim 5, wherein, in a width direction of the gate line, an orthographic projection of the gate line onto the base substrate falls within an orthographic projection of the conductive shield layer onto the base substrate, and the orthographic projection of the conductive shield layer onto the base substrate falls within an orthographic projection of the black matrix onto the base substrate.

7. The array substrate of claim 5, wherein in the width direction of the gate line both an orthographic projection of the common electrode line onto the base substrate and an orthographic projection of the gate line onto the base substrate fall within an orthographic projection of the black matrix onto the base substrate.

8. The array substrate of claim 7, further comprising:
   a thin film transistor comprising a gate electrode disposed in the same layer as the gate line and connected to the gate line, a source electrode disposed in a same layer as the data line and connected to the data line, and a drain electrode disposed in the same layer as the data line and connected to the pixel electrode;
   a passivation layer disposed between the thin film transistor and the pixel electrode; and
   a planarization layer disposed between the passivation layer and the pixel electrode.

9. The array substrate of claim 8, further comprising a color film layer between the passivation layer and the pixel electrode.

10. The array substrate of claim 1, wherein the conductive shield layer is configured to receive a constant voltage.

11. A display panel comprising the array substrate of claim 1.

12. A display device comprising the display panel of claim 11.

13. A method of manufacturing an array substrate, comprising:
   providing a base substrate;
   forming a gate line, a gate electrode and a common electrode line on the base substrate, the gate electrode being connected to the gate line;
   forming a gate insulating layer covering the gate electrode, the gate line, the common electrode line, and the base substrate;

forming an active layer on the gate insulating layer, the active layer being located on a region of the gate insulating layer corresponding to the gate electrode;

forming a source electrode, a drain electrode, and a data line, the source electrode and the drain electrode being in contact with the active layer, and the source electrode being connected to the data line;

forming a passivation layer covering the source electrode, the drain electrode, the active layer, the data line, and the gate insulating layer;

forming a planarization layer;

forming a first via to expose the drain electrode;

forming a pixel electrode connected to the drain electrode through the first via;

forming an interlayer insulating layer covering the pixel electrode and the planarization layer;

forming a second via to expose the common electrode line;

forming a conductive shield layer that at least partially overlaps the data line when viewed from a direction perpendicular to the base substrate; and forming a black matrix covering the conductive shield layer;

wherein the forming the conductive shield layer further comprises forming a common electrode connected to the common electrode line through the second via, and the common electrode is located on a side of the pixel electrode facing away from the base substrate and disposed in a same layer as the conductive shield layer, and wherein the black matrix covers and contacts the conductive shield layer, the second via and a portion of the common electrode.

14. The method of claim 13, further comprising after the forming the passivation layer and before the forming the planarization layer, forming a color film layer covering the passivation layer.

15. A display panel comprising the array substrate of claim 2.

\* \* \* \* \*